(12) United States Patent
Turnbull et al.

(10) Patent No.: US 8,111,179 B2
(45) Date of Patent: Feb. 7, 2012

(54) METHOD AND SYSTEM FOR REDUCING SIGNAL DISTORTION IN A CONTINUOUSLY VARIABLE SLOPE DELTA MODULATION SCHEME

(75) Inventors: Robert R. Turnbull, Holland, MI (US); Alan R. Watson, Buchanan, MI (US)

(73) Assignee: Gentex Corporation, Zeeland, MI (US)

( * ) Notice: Subject to any disclaimer, the term of this patent is extended or adjusted under 35 U.S.C. 154(b) by 1229 days.

(21) Appl. No.: 11/780,212

(22) Filed: Jul. 19, 2007

(65) Prior Publication Data

US 2008/0049848 A1 Feb. 28, 2008

Related U.S. Application Data

(60) Provisional application No. 60/807,958, filed on Jul. 21, 2006.

(51) Int. Cl.
*H03M 3/00* (2006.01)
(52) U.S. Cl. .......................................... 341/143; 341/168
(58) Field of Classification Search .................. 341/143, 341/166–168
See application file for complete search history.

(56) References Cited

U.S. PATENT DOCUMENTS

| | | | | |
|---|---|---|---|---|
| 4,042,921 A * | 8/1977 | Smith | | 341/138 |
| 4,123,709 A * | 10/1978 | Dodds et al. | | 375/249 |
| 4,411,002 A * | 10/1983 | Auger | | 375/249 |
| 4,783,644 A * | 11/1988 | Kilchsperger | | 341/166 |
| 5,727,023 A * | 3/1998 | Dent | | 375/244 |
| 6,661,360 B2 * | 12/2003 | Lambert | | 341/131 |
| 6,980,092 B2 * | 12/2005 | Turnbull et al. | | 340/425.5 |
| 2002/0032510 A1 * | 3/2002 | Turnbull et al. | | 701/49 |
| 2004/0119619 A1 | 6/2004 | Lambert | | |

FOREIGN PATENT DOCUMENTS

WO PCT/US2007/073987 1/2009

OTHER PUBLICATIONS

MIL-STD-188-113, pp. 18-27, and App. C, pp. 53-58 (undated).
Bluetooth, Bluetooth Specification Vers. 1.2 [vol. 2], Chp. 9, pp. 73-76 and App. A, pp. 182-184 (Nov. 5, 2003).
Bluetooth, Bluetooth Specification Vers. 1.1, p. 141.
Madhavi K. Ganapathiraju, N. Alakrishnan, Raj Reddy, "Improving Recognition Accuracy on CVSD Speech under Mismatched Conditions," School of Computer Science, Carnegie Mellon University (Pittsburgh, PA) (undated), 6 pages.
Joseph Tierney and Marilyn L. Malpass, "Enhanced CVSD—An Embedded Speech Coder for 64-16 KBPS," pp. 840-843, M.I.T. Lincoln Laboratory (Lexington, MA) (1981).
Hwang Soo Lee and Chong Kwan Un, "Quantization Noise in Adaptive Delta Modulation Systems," IEEE Transactions on Communications, vol. COM-28, No. 16 (Oct. 1980) pp. 1794-1802.
Orthman O. Khalifa, S. Khan, Rafiqul Islam, Mohd. Bin Muktar, and Zahrein Yaacob, "Speech Coding for Bluetooth with CVSD Algorithm," 2004 RF and Microwave Conference, Subang, Selangor, Malaysia (Oct. 5-6, 2004), pp. 227-229.

* cited by examiner

*Primary Examiner* — Khai M Nguyen
(74) *Attorney, Agent, or Firm* — Price Heneveld LLP; Scott P. Ryan

(57) ABSTRACT

A rearview assembly includes a mounting structure for attaching to a vehicle. The mounting structure includes a housing that has a rearview element disposed inside for providing a driver of the vehicle with a view to the rear of the vehicle. The rearview assembly also includes a continuously variable slope delta encoder module in or on the mounting structure configured to generate a feedback signal. The rearview assembly also includes a pre-processing module on or within the mounting structure. The pre-processing module is configured to process a source signal and the feedback signal from the continuously variable slope delta encoder module, and to provide a pre-processed signal to the continuously variable slope delta encoder module based on the value of the source signal and the feedback signal.

64 Claims, 14 Drawing Sheets

4-32 kHz noise reduced by feedback

METHOD AND SYSTEM FOR REDUCING SIGNAL DISTORTION IN A CONTINUOUSLY VARIABLE SLOPE DELTA MODULATION SCHEME

CROSS-REFERENCE TO RELATED APPLICATION

This application claims the benefit under 35 U.S.C. §119(e) of U.S. Provisional Patent Application No. 60/807,958, entitled "METHOD AND SYSTEM FOR REDUCING SIGNAL DISTORTION IN A CONTINUOUSLY VARIABLE SLOPE DELTA MODULATION SCHEME," filed on Jul. 21, 2006, the entire disclosure of which is incorporated herein by reference.

BACKGROUND OF THE INVENTION

The present invention generally relates to improving signal quality in communication systems, and, more particularly, to methods for reducing distortion in communication systems employing continuously variable slope delta modulation in automobiles.

Wireless devices are increasingly employed in a wide variety of communication systems and applications. Examples of wireless-capable devices that have become increasingly popular include cellular telephones, pagers, home computers, laptop computers, and PDAs. A number of wireless communication protocols have developed to support communication among wireless devices, including, among others, 802.11 and BLUETOOTH. In addition to supporting communication among devices such as laptops, cellular phones, and PDAs, some of these protocols also provide the ability to wirelessly connect I/O devices, such as mice, keyboards, microphones, and speakers, to other devices, such as cellular phones and laptops.

The wireless connection of devices, such as microphones, to other wireless devices, such as cellular telephones, is particularly attractive because a wireless connection allows the user to be freed from often cumbersome and inconvenient wired connections to devices. Wireless connections also provide an additional advantage of allowing a single device, such as an I/O device, to be connected to a variety of other devices like cellular phones and computers, without requiring matching physical connecting structures on the devices to be connected. This helps to make the devices more interchangeable and flexible. For example, a BLUETOOTH microphone could be used by a variety of BLUETOOTH-capable phones without a need to worry about a matching physical connection. Wireless microphones can be particularly advantageous in an automotive environment where, for example, wireless microphones can be mounted in the vehicle (such as in a rearview mirror assembly), and used to connect to wireless devices (such as cellular phones) that are brought into the vehicle by various users.

While information communicated wirelessly can be in either analog or digital format, transmitting information in digital format does have advantages. For example, signal to noise ratios in digitally encoded signals typically do not vary with the transmission distance, and hardware for switching and processing digital signals can be less expensive than that required for analog systems. In addition, power consumption in digital systems can be lower than power consumption in analog systems. Because many of the signals to be transmitted and received in a digital network start out in analog form (for example, voice input to a microphone), it is often necessary to convert analog signals to digital form to enable effective wireless communication. Delta modulation is one method that can be used to convert analog signals, such as voice signals, into a digital pulse stream for digital communication purposes.

One form of delta modulation that has found use in wireless communication applications is Continuously Variable Slope Delta (CVSD) modulation. CVSD modulation is a method for coding speech or other waveforms as a pulse stream, and is often used in BLUETOOTH applications. This relatively low bit-rate method is attractive in part because of its relative simplicity and low implementation cost. When used in conjunction with wireless communication, a CVSD encoder is often used to convert an analog speech input signal into a digital pulse stream output. The output digital pulse stream can then be wirelessly transmitted to a CVSD decoder in a receiver, which converts the digital pulse stream to an analog signal for use by the receiver (i.e., for playback on a loudspeaker), or subsequent transmission by a cellular telephone transceiver.

Referring to FIGS. 1 and 2, operation of a typical CVSD modulation scheme will now be discussed. FIG. 1 illustrates a CVSD encoder 11 having a comparator 13 for comparing an input source signal with an integrated signal from an integrator 22. If the voltage of the input source signal exceeds the voltage from integrator 22, comparator 13 will output a digital "1." If the voltage of the input source signal is less than the voltage from integrator 22, comparator 13 will output a digital "0." The output signal from comparator 13 is provided to shift register 14, which stores the current output value of comparator 13 along with the previous 2 values of comparator 13. The output signal from comparator 13 is also provided as a digital signal output from the CVSD encoder, which can then be provided to a transmitter for transmission to a receiver. Over time, this digital signal output takes the form of a pulse stream of "1's" and "0's." The output signal from comparator 13 is also provided to a pulse amplitude modulator 20, which applies a positive or negative charge to integrator 22 depending on whether the output signal from comparator 13 is a "1" (resulting in a positive charge being applied to integrator 22) or a "0" (resulting in a negative charge being applied to integrator 22). Logic 16 monitors the values of the bits in shift register 14 and performs an "overload" algorithm. The purpose of the algorithm is to determine when the CVSD encoder circuitry is in a slew rate limited condition. A slew rate limited condition occurs when the difference between the integrated signal from integrator 22 and the source signal is so great that integrator 22 is unable to reach the level of the source signal within a certain time period. A slew rate limited condition is indicated when the values in shift register 14 are equal (either all "1's" or "0's").

When the algorithm performed by logic 16 determines that the values in shift register 14 are equal, it provides a signal to syllabic filter 18 indicating that a slew rate limited condition exists. Syllabic filter 18 then sends a signal to pulse amplitude modulator 20 to either increase or decrease the amount of current being applied to integrator 22, depending on whether the integrated voltage needs to increase or decrease more quickly to match the source signal. In addition, syllabic filter 18 determines how long the circuitry has been in a slew rate limited condition, and sends signals to pulse amplitude modulator 20 to increase the rate of increase/decrease in current applied to integrator 22. Syllabic filter 18 will cause pulse amplitude modulator 20 to continue to increase/decrease the rate of change in current applied to pulse amplitude modulator 22 until logic 16 determines that a slew rate limited condition no longer exists.

The effect of the operations discussed above is to provide an output of integrator 22 that tracks the voltage of the source signal. These operations also result in the digital output signal of CVSD encoder 11 being a digital pulse stream indicative of whether the source input voltage is increasing (a stream of 1s), decreasing (a stream of 0s), or staying the same (stream of alternating 1s and 0s).

FIG. 2 illustrates a typical CVSD decoder 12. Much of the circuitry in decoder 12 is identical to the circuitry in encoder 11. In operation, decoder 12 receives a digital pulse stream output from CVSD encoder 11, and provides it to a pulse amplitude modulator 20. As noted above, pulse amplitude modulator 20 applies either a negative or positive charge to integrator 22, depending on the whether the input is a digital "1" (positive charge applied to integrator 22), or a digital "0" (negative charge applied to integrator 22). Decoder 12 also contains a shift register 14, logic 16, and syllabic filter 18, for determining if the signal is in a slew rate limited condition, and for increasing/decreasing the rate of change of the charge applied to integrator 22 based on the existence and duration of a slew rate limited condition. By using elements in the decoder circuitry that are identical to the elements in the transmit circuitry, the decoder circuitry is able to convert the digital pulse stream into an analog output signal that tracks the input source signal of the encoder 11.

While the CVSD encoding and decoding scheme discussed above and shown in FIGS. 1 and 2 can be a practical and cost-effective tool for communicating voice and other signals, it does have limitations. For example, when transmitting audio, such as voice signals, CVSD encoders can introduce subharmonics and other nonlinearities into the encoded audio. The CVSD encoder can also introduce level-dependent frequency response variations into the signal. CVSD modulation also has a fairly limited dynamic range. At higher signal levels, distortion and slew rate limiting can become severe. At lower signal levels, the noise floor can become an issue. These and other limitations can reduce the intelligibility of the signals communicated in a CVSD modulation scheme, and can also reduce the effectiveness of software or devices utilizing or interpreting CVSD-processed signals. For example, the effectiveness of speech recognition software operating on signals received through a BLUETOOTH link can be reduced by these limitations.

The inventors have recognized a need to provide a method for reducing nonlinear distortion and improving the frequency response of systems employing CVSD modulation, and for optimizing the dynamic range associated with systems employing CVSD modulation. The inventors have also recognized a need to provide the above-noted advantages while providing for an improved CVSD encoder that is compatible with the Bluetooth specification, and with existing typical CVSD decoders, such as, for example CVSD decoders complying with the Bluetooth specification or the MIL-STD-188-113 specification. This allows for improved performance of existing CVSD decoders and applications employing existing CVSD decoders. More specifically, this allows for improved performance of millions of existing Bluetooth devices already in the field when those existing Bluetooth devices are used in conjunction with the improved encoder.

SUMMARY OF THE INVENTION

In accordance with one aspect of the present invention, a rearview assembly for a vehicle is provided. The rearview assembly includes a mounting structure for attaching to a vehicle. The mounting structure includes a housing that has a rearview element disposed inside for providing a driver of the vehicle with a view to the rear of the vehicle. The rearview assembly also includes a continuously variable slope delta encoder module in or on the mounting structure configured to generate a feedback signal. The rearview assembly also includes a pre-processing module on or within the mounting structure. The pre-processing module is configured to process a source signal and the feedback signal from the continuously variable slope delta encoder module, and to provide a pre-processed signal to the continuously variable slope delta encoder module based on the value of the source signal and the feedback signal.

In accordance with another aspect of the present invention, a system for reducing signal distortion in a device employing a continuously variable slope delta modulation scheme is provided. The system includes a continuously variable slope delta encoder module configured to generate a feedback signal. The system also includes a pre-processing module configured to receive a source signal and the feedback signal, generate a pre-processed signal that is a function of the source signal and the feedback signal, and provide the pre-processed signal to the continuously variable slope delta encoder module.

In accordance with yet another aspect of the present invention, an audio/data transceiver device is provided. The audio/data transceiver device includes a continuously variable slope delta encoder module configured to generate a feedback signal. The audio/data transceiver device also includes a pre-processing module configured to receive a source signal and the feedback signal from the continuously variable slope delta encoder module, and to generate a pre-processed signal that is a function of the source signal and the feedback signal. The system further includes a wireless audio/data transceiver coupled to at least one of the continuously variable slope delta encoder module and the pre-processing module.

In accordance with still another aspect of the present invention, a method for reducing distortion in a system employing continuously variable slope delta modulation is provided. The method includes the steps of providing a continuously variable slope delta encoder module that encodes an input signal, providing a source signal for encoding by the continuously variable slope delta encoder module, and generating a feedback signal in the continuously variable slope delta encoder module. The method also includes the steps of altering the source signal based on the feedback signal generated in the continuously variable slope delta encoder module to provide a pre-processed signal, and providing the pre-processed signal as the input signal to the continuously variable slope delta encoder module.

These and other features, advantages, and objects of the present invention will be further understood and appreciated by those skilled in the art by reference to the following specification, claims, and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

Figure 1:
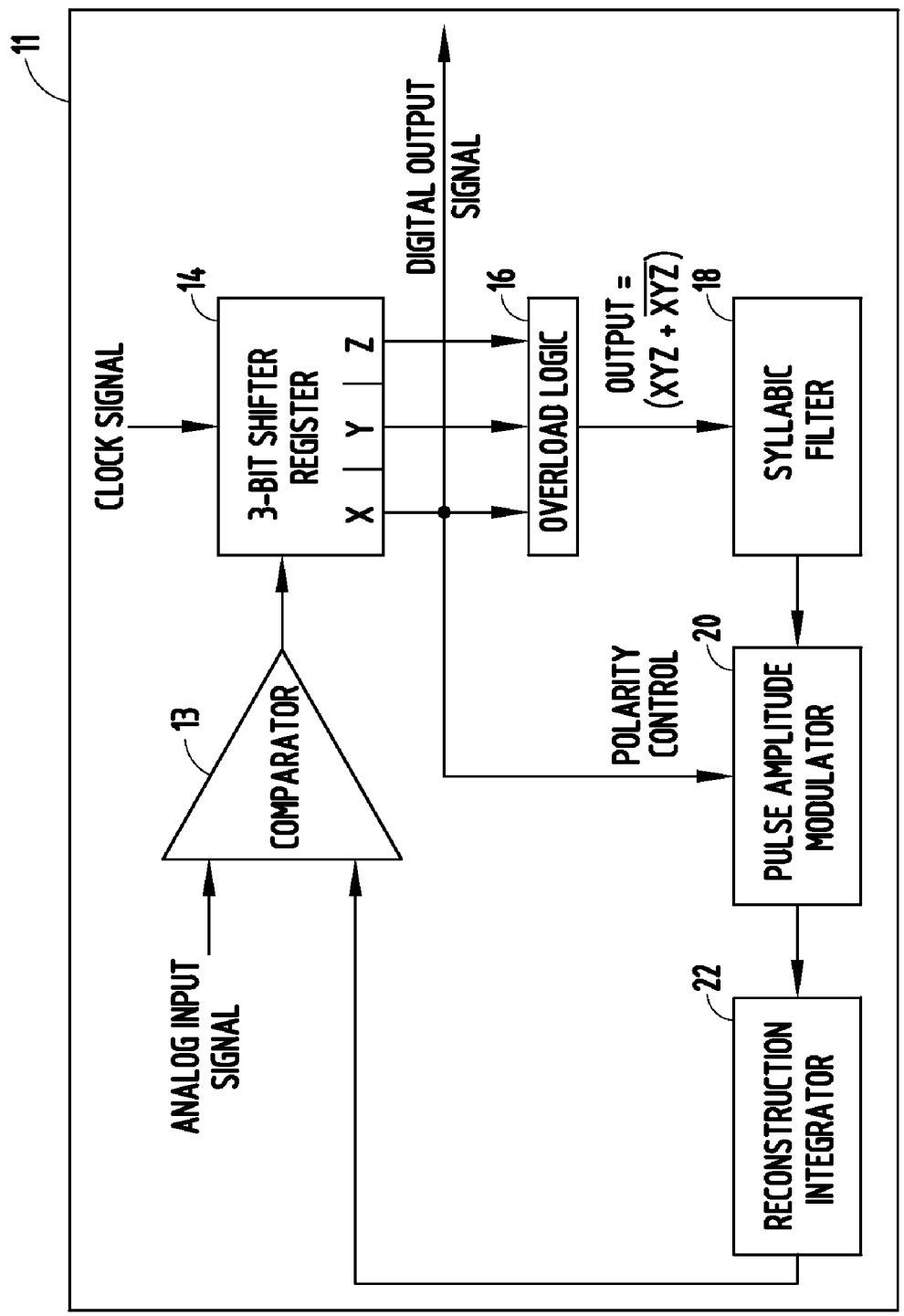
FIG. 1 is a schematic diagram illustrating a continuously variable slope delta modulation encoder that is generally known in the art.
Figure 2:
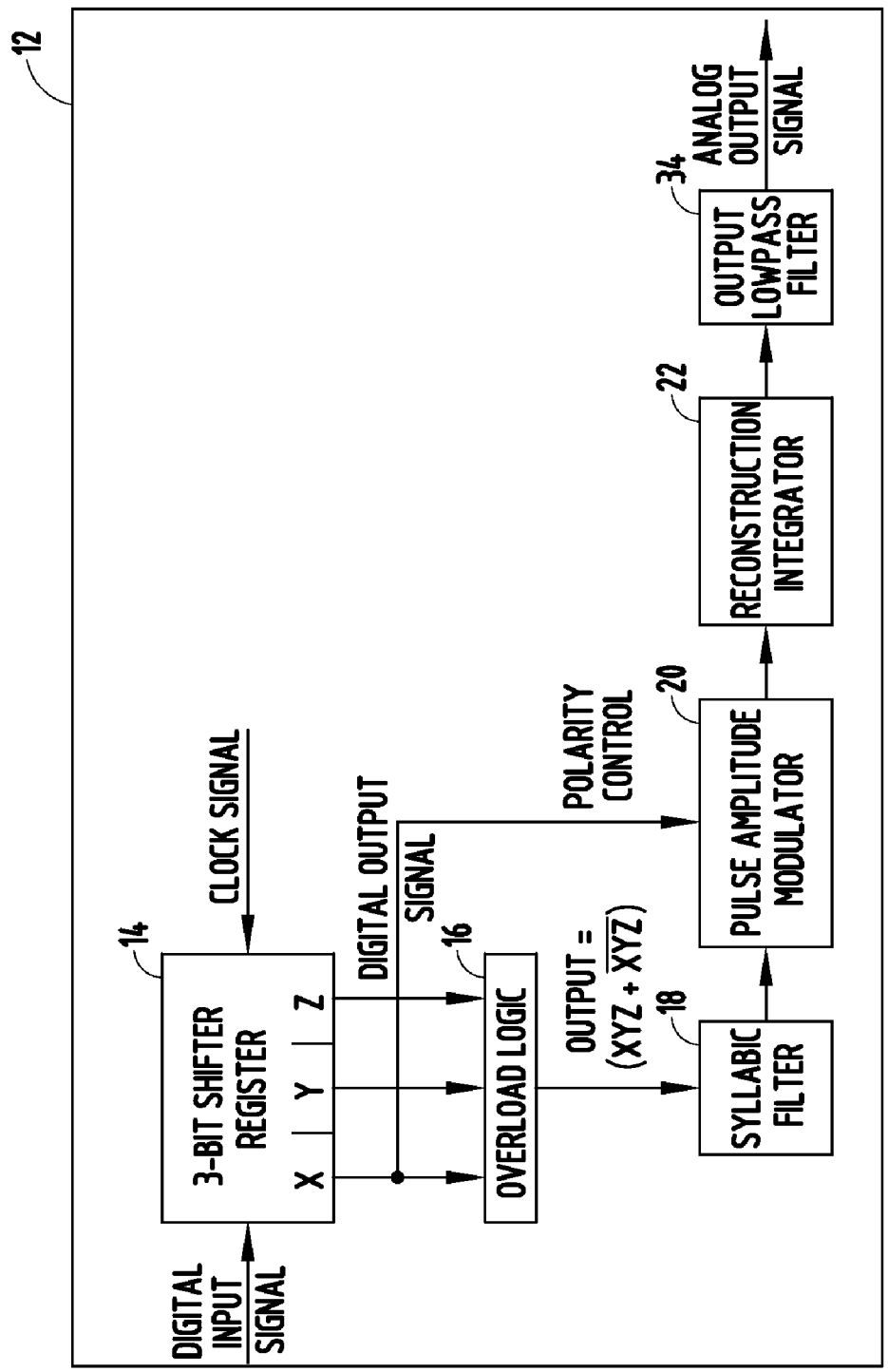
FIG. 2 is a schematic diagram illustrating a continuously variable slope delta modulation decoder generally known in the art.
Figure 3:
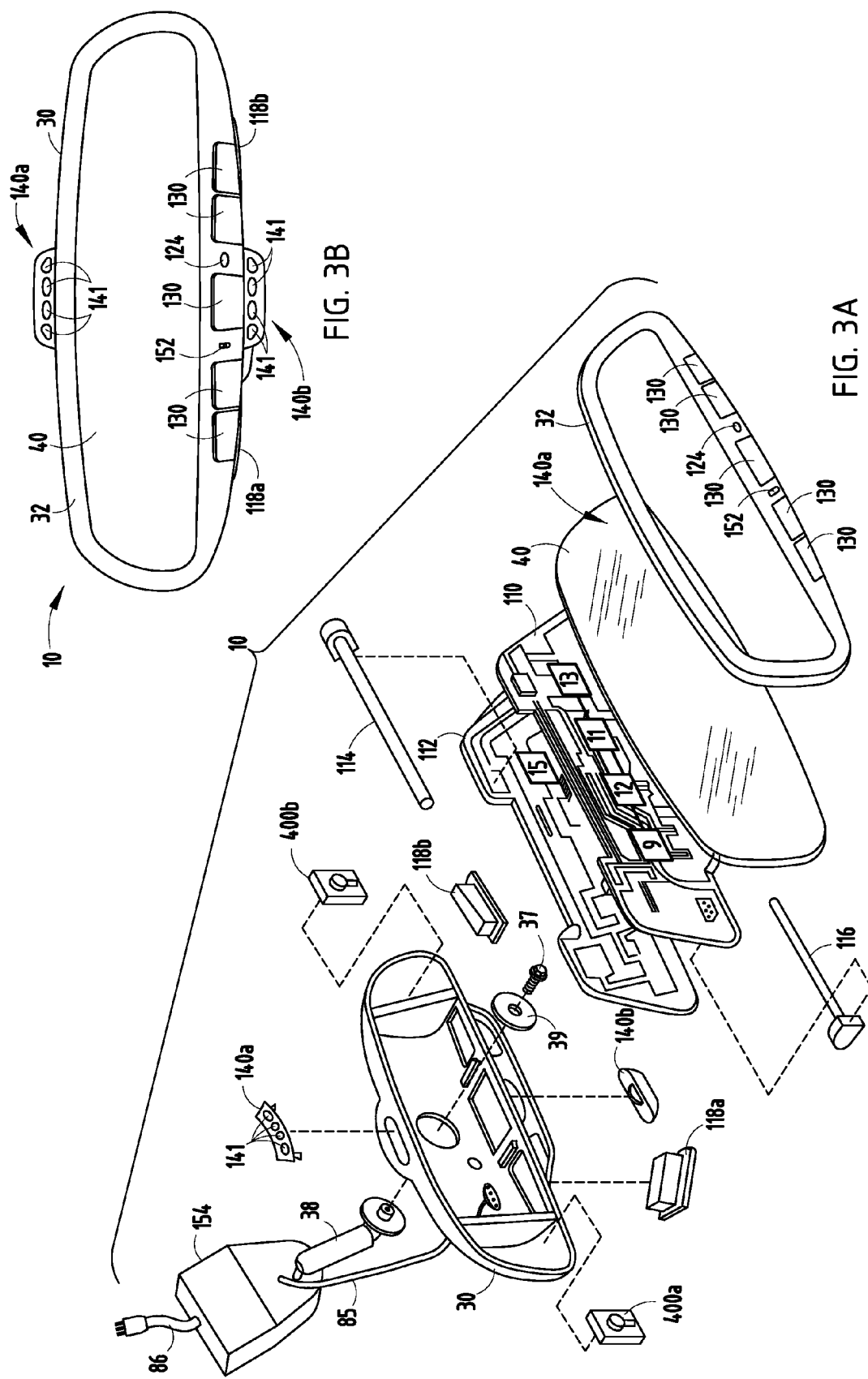
FIG. 3A is an exploded perspective view illustrating a rearview assembly for a vehicle, according to one embodiment of the present invention.
FIG. 3B is a front elevational view illustrating a rearview assembly for a vehicle, according to another embodiment of the present invention.

An example of a vehicle inside rearview assembly 10 constructed in accordance with one embodiment of the present invention is shown in FIGS. 3A and 3B. The rearview assembly 10 includes a mount housing or mounting structure 154 and a stem 38 for attaching housing 30, and elements in and on housing 30, to a vehicle. As shown, housing 30 is attached to stem 38 by means of a bolt 37 through a spacer 39. As also shown, housing 30 is configured such that a number of devices can be mounted in or on the housing 30. These devices include, but are not limited to, speakers 400A and 400B, microphone housings 140A and 140B, including microphone transducers 141, map lamps 118A and 118B, first and second RF antennas 114 and 116, first and second printed circuit boards (PCBs) 110 and 112, and a rearview element 40. Rearview assembly 10 also includes multi-conductor cables 86 and 85 for coupling devices located in mount housing 154 and/or housing 30 to vehicle devices, such as, for example, a vehicle bus, the vehicle battery, external antennas, and the vehicle radio system. Rearview assembly 10 is also shown having a bezel 32 for securing rearview element 40 and the other elements in mirror housing 30. The rearview element is configured to provide a driver of the vehicle with a view to the rear of the vehicle. Bezel 32 is also shown having user push buttons 130, LED indicator 152, and a glare sensor 124. U.S. patent application Ser. No. 10/849,644, entitled "REARVIEW MIRROR ASSEMBLIES INCORPORATING HANDS-FREE TELEPHONE COMPONENTS," by Alan R. Watson et al., filed on May 19, 2004, the entire disclosure of which is incorporated herein by reference, discloses additional rearview assemblies that can be configured to incorporate the present invention.

In one embodiment of the present invention, first PCB 110 includes a pre-processing module 12 and a continuously variable slope delta encoder module 11. First PCB 110 also includes an input module 9 coupled to microphone transducers 141 in microphone housings 140A and 140B, and to pre-processing module 12. Input module 9 is configured to supply signals provided by microphone transducers 141 in microphone housings 140A and 140B to pre-processing module 12. First PCB 110 is also shown having a first wireless audio/data transceiver 13 coupled to one of the pre-processing module 12 and the continuously variable slope delta encoder module 11. Second PCB 112 is shown having a second wireless audio/data transceiver 15 for receiving and sending wireless signals, including wireless signals from the first wireless audio/data transceiver 13.

The high-level operation of the rearview assembly communication elements shown in FIG. 3A will now be described. First, microphone transducers 141 in microphone housings 140A or 140B, or both, pick up a source signal that is a voice signal from an occupant of the vehicle. These voice signals are translated into electrical signals and provided to input module 9. It should be appreciated that each microphone housing 140A and 140B may have multiple microphone transducers, and these may output multiple signals. Input module 9 provides at least one of the signals generated by microphone transducers 141, or a combination of signals generated by microphone transducers 141, to pre-processing module 12. As shown in FIG. 3A, pre-processing module 12, in addition to receiving the source signal from input module 9, also receives a feedback signal from the continuously variable slope delta encoder module 11. Pre-processing module 12 subtracts the feedback signal from the source signal received from input module 9, integrates the signal, and provides the resulting pre-processed signal to continuously variable slope delta encoder module 11. Continuously variable slope delta encoder module 11 converts the pre-processed signal into a digital pulse stream, and may also generate a feedback signal, providing the feedback signal to circuitry within continuously variable slope delta encoder module 11 and optionally to pre-processing module 12. As shown in FIG. 3A, the digital output signal generated by continuously variable slope delta encoder module 11 is provided to a first wireless audio/data transceiver 13, which transmits a digital pulse stream to other audio/data transceivers capable of decoding the transmitted digital pulse stream via an antenna 114 or 116. These other audio/data transceivers can include a second wireless audio/data transceiver 15.

Continuously variable slope delta encoder module 11 may also provide a syllabic signal indicative of a syllabic rate of speech in the pre-processed signal to pre-processing module 12. Pre-processing module 12 may use this syllabic signal to alter the level of the pre-processed signal provided by pre-processing module 12 to continuously variable slope delta encoder module 11. By using the feedback signal and/or the syllabic signal, pre-processing module 12 can improve the quality of the digital output signal from continuously variable slope delta encoder module 11.

Although the second wireless audio/data transceiver 15 is shown as part of second PCB 112, it should be noted that second wireless audio/data transceiver 15 and other wireless audio/data transceivers could be located in or proximate to the vehicle such that second wireless audio/data transceiver 15 is capable of receiving a digital signal from first wireless audio/data transceiver 13. First and second wireless audio/data transceivers 13 and 15 are preferably BLUETOOTH transceivers. Either one or both of first and second wireless audio/data transceivers 13 and 15 could optionally be cellular transceivers, or any other audio/data transceiver capable of sending and/or receiving a digital pulse stream.

Although FIG. 3A shows pre-processing module 12 receiving a source signal from input module 9, it should be understood that pre-processing module 12 could receive a source signal directly from a microphone transducer 141 located in the vehicle, or from other circuitry capable of providing an input signal. In addition to voice signals, it should be understood that pre-processing module 12 and continuously variable slope delta encoder module 11 are capable of receiving and processing other signals, including data signals and music signals.

Although FIG. 3B shows microphone housings 140A and 140B including microphone transducers 141 attached to rearview housing 30, the microphone transducers 141 may be located in recessed locations of the rearview assembly.

Although in the present embodiment, input module 9, pre-processing module 12, continuously variable slope delta encoder module 11, first and second wireless audio/data transceiver modules 13 and 15, and microphone transducers 141 are shown being located in a rearview assembly 10, it should be appreciated that any or all of these elements could be located in a location other than rearview assembly 10, such as in a stand-alone module (not shown).

Figure 4:
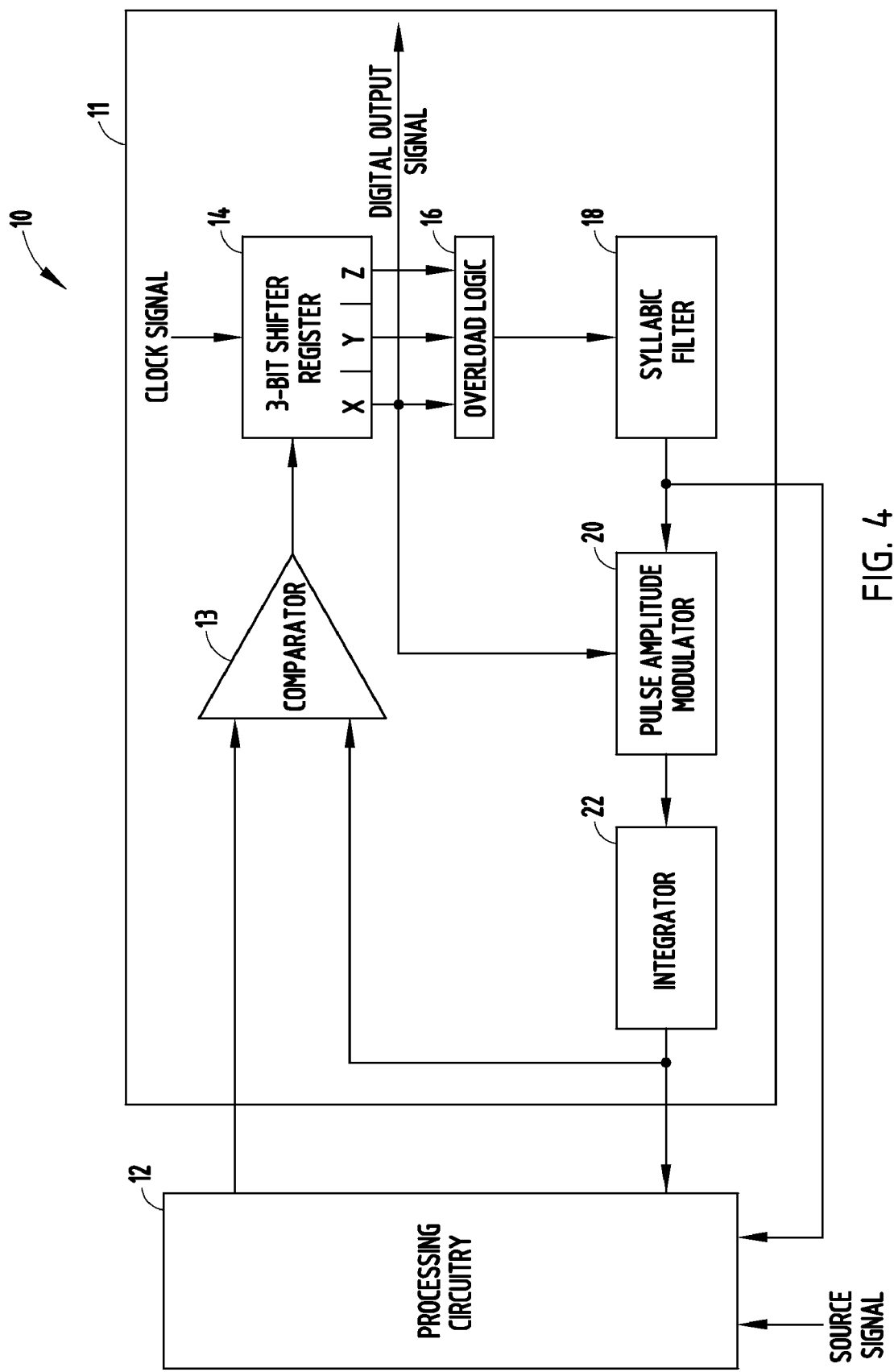
FIG. 4 is a schematic diagram illustrating a system for reducing signal distortion in a device employing continuously variable slope delta modulation, according to another embodiment of the present invention.

FIG. 4 provides additional detail of a system for reducing signal distortion in a device employing continuously variable slope delta modulation, according to another embodiment of the present invention. As shown, the system 10 includes both a pre-processing module 12 and a continuously variable slope delta encoder module 11, such as continuously variable slope modulator/demodulator MC3418 previously available from Motorola Semiconductor. In an alternate embodiment, continuously variable slope delta encoder module 11 is implemented in software in a digital signal processor (DSP), or is an ASIC designed to provide continuously variable slope delta encoder functionality. As shown, continuously variable slope delta encoder module 11 contains elements typically found in a continuously variable slope delta encoder module. These elements include a comparator 13 having an input signal input and a feedback input from an integrator 22, and having an output to a 3-bit shift register 14. As noted above, comparator 13 compares the value of an input signal with the feedback signal from integrator 22, outputting a digital "1" if the voltage of the input signal is greater than the voltage of the feedback signal, and outputting a digital "0" if the input signal voltage is less than the feedback signal voltage. This digital output is transmitted to the 3-bit shift register 14, which stores the present value of the digital output and the previous two values of the digital output. The 3-bit shift register 14 is also connected to a digital output line for outputting the present value of the digital output of comparator 13. The 3-bit shift register 14 is also connected to overload logic 16, and provides the present value of the output of comparator 13, along with the previous two values of comparator 13, to overload logic 16. The 3-bit shift register 14 also provides the present value of the output of comparator 13 (a digital "1" or a digital "0") to pulse amplitude modulator 20. Pulse amplitude modulator 20 provides either a positive or negative charging current to integrator 22, based on the digital value it receives from 3-bit shift register 14 indicating the present value of comparator 13. If the value received from 3-bit shift register 14 is a "1," pulse amplitude modulator 20 provides a charging current to integrator 22. If the digital value received from 3-bit shift register 14 is a "0," pulse amplitude modulator 20 provides a negative, or discharge, current to integrator 22.

To determine the magnitude of the charging or discharging current provided to integrator 22 and the rate at which that current changes, pulse amplitude modulator 20 uses as an input a syllabic signal received from syllabic filter 18. Syllabic filter 18 is also shown connected to overload logic 16. In operation, overload logic 16 evaluates the values stored in 3-bit shift register 14 to determine whether the encoder module is in a slew rate limited condition (also known as an overload condition). A slew rate limited condition is indicated when the values in 3-bit shift register 14 are equal (all "1's" or all "0's"). When overload logic 16 determines that a slew rate limited condition exists, it sends a syllabic signal to syllabic filter 18. Syllabic filter 18 monitors the output signal from overload logic 16 to determine if an overload condition exists and how long that condition has existed. Based on the existence of a slew rate limited condition and the length of time that the slew rate limited condition has existed, syllabic filter 18 provides a signal to pulse amplitude modulator 20 to increase or decrease the charging or discharging current applied to integrator 22, and by how much.

Unlike in traditional continuously variable slope delta encoder modules, FIG. 4 shows syllabic filter 18 also providing a syllabic signal to pre-processing module 12. As noted above, this syllabic signal is indicative of whether or not a slew rate limited condition exists and how long a slew rate limited condition has existed. As discussed below, pre-processing module 12 uses this information to determine how to process a source signal to form a pre-processed signal to be provided to continuously variable slope delta encoder module 11.

Returning to continuously variable slope delta encoder module 11, integrator 22 is shown receiving charging and discharging signals from pulse amplitude modulator 20, and providing a feedback signal to comparator 13. As integrator 22 is charged or discharged based on the digital value output from comparator 13 and the existence of a slew rate limited condition, the feedback signal of integrator 22 will, over time, track the value of the input signal to comparator 13.

Unlike in traditional continuously variable slope delta encoder modules, FIG. 4 also shows integrator 22 providing a feedback signal to pre-processing module 12. Pre-processing module 12 uses the feedback signal provided by integrator 22 to determine how to pre-process a source signal to form a pre-processed signal before providing that pre-processed signal to continuously variable slope delta encoder module 11. As shown in FIG. 4, rather than receiving an input signal directly from a source, such as a microphone, or other signal source, continuously variable slope delta encoder module 11 receives a pre-processed signal as an input signal from pre-processing module 12. Pre-processing module 12 is shown receiving a source signal from a source, such as a microphone. Pre-processing module 12 alters the source signal, based on the feedback signal received from integrator 22, and provides a pre-processed signal to continuously variable slope delta encoder module 11. Pre-processing module 12 is also shown receiving a syllabic signal from syllabic filter 18. Pre-processing module 12 also alters the source signal based on this syllabic signal to provide a pre-processed signal to comparator 13 of continuously variable slope delta encoder module 11. It should be understood that pre-processing module 12 can alter the source signal to provide a pre-processed signal using either the feedback signal from integrator 22, the syllabic signal from syllabic filter 18, or both signals simultaneously.

Figure 5:
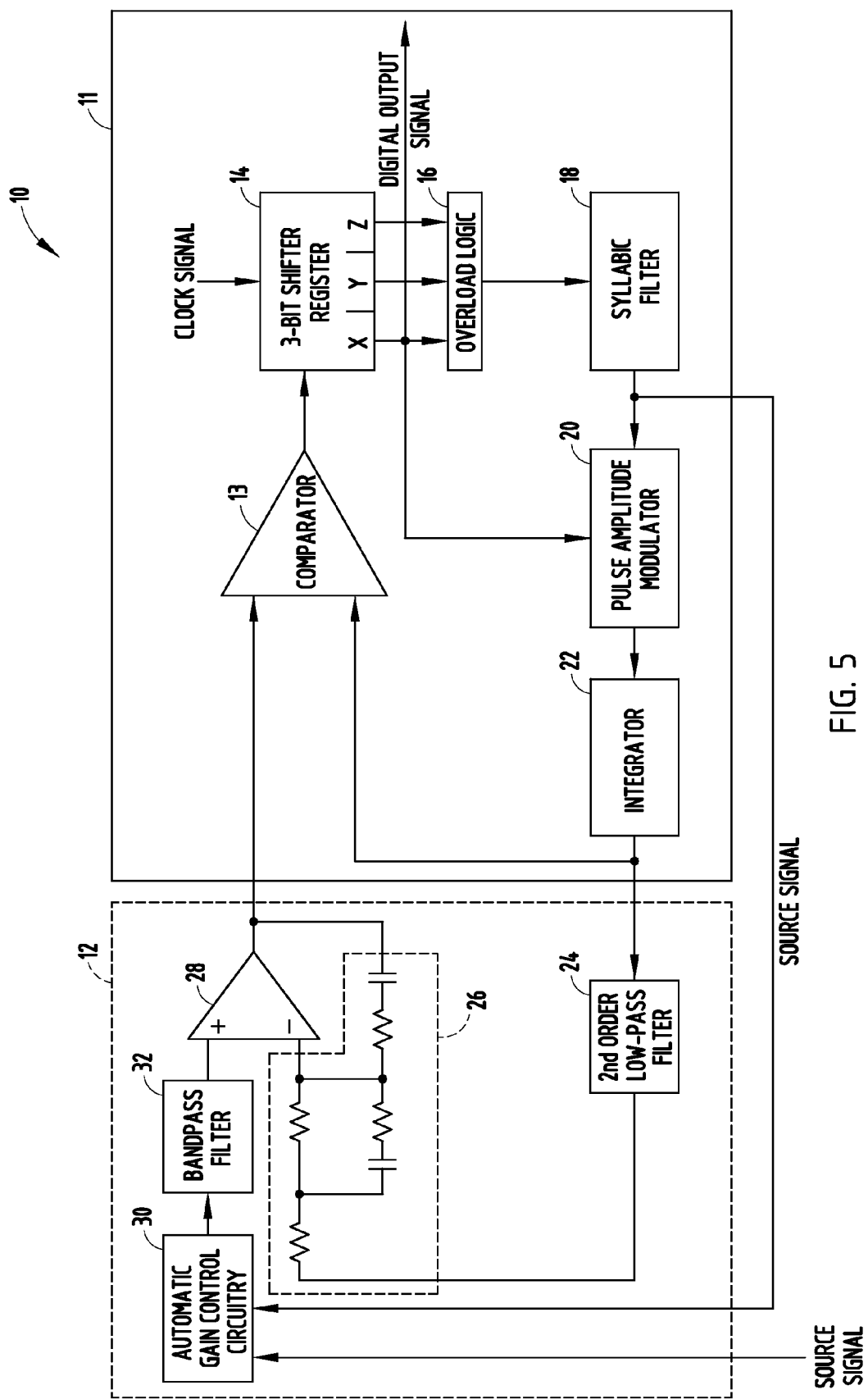
FIG. 5 is a schematic diagram further illustrating a system for reducing signal distortion in a device employing continuously variable slope delta modulation, according to one embodiment of the present invention.

FIG. 5 provides additional detail for one possible implementation of pre-processing module 12. The source signal provided to pre-processing module 12 is first provided to automatic gain control circuitry 30. As shown, automatic gain control circuitry is an Analog Devices SSM2120 that has been configured to operate as a compressor. In an alternate embodiment, automatic gain control circuitry 30 is implemented in software in a digital signal processor. In still another alternate embodiment, automatic gain control circuitry is implemented in an ASIC. The syllabic signal from syllabic filter 18 provided to pre-processing module 12 is also coupled to automatic gain control circuitry 30. Based on the value of the signal received from syllabic filter 18, automatic gain control circuitry 30 increases, decreases, or leaves unchanged the level of the signal provided to the remaining circuitry in pre-processing module 12. For example, if automatic gain control circuitry 30 determines, based on the signal from syllabic filter 18, that a slew rate limited condition exists, automatic gain control circuitry 30 can decrease the amplitude of the input signal to help alleviate the slew rate limited condition. It should be understood that automatic gain control circuitry 30 can be any circuitry capable of varying the amplitude of the source signal based on a signal received from syllabic filter 18.

Automatic gain control circuitry 30 provides the source signal, modified or unmodified, to bandpass filter 32 for filtering. As shown, bandpass filter 32 is a 3.7 kHz $4^{th}$ order lowpass cascaded with a 200 Hz $4^{th}$ order highpass filter. After being filtered, the signal is then provided to the positive input of comparator 28. Pre-processing module 12 is also shown receiving a feedback signal from integrator 22. As shown, the signal is first provided to a second order low-pass filter 24, which is a 3.7 kHz $4^{th}$ order lowpass filter. After being filtered, the feedback signal is connected through a resistor and capacitor network 26 to the negative input of comparator 28 and to the output of comparator 28. This has the effect of subtracting the value of the filtered feedback signal provided by integrator 22 from the gain-adjusted source signal from automatic gain control circuitry 30, and integrating that difference. This integrated difference at the output of comparator 28 is shown being provided as a pre-processed signal input to continuously variable slope delta encoder module 11. The processing by pre-processing module 12 using feedback and syllabic signals from continuously variable slope delta modulator 11 can have the effect of substantially decreasing the distortion associated with continuously variable slope delta encoder module 11. One skilled in the art will appreciate that the functionality discussed in FIGS. 3A-5 can be implemented using discrete components or integrated circuits, and may also be implemented in software algorithms running on microcontrollers, digital signal processors (DSPs), or computers. It should be noted that although FIGS. 3A-5 illustrate the use of the invention in analog implementations of continuously variable slope delta modulation, it should be appreciated that the invention can also be applied to digital implementations of continuously variable slope delta modulation.

Figure 6:
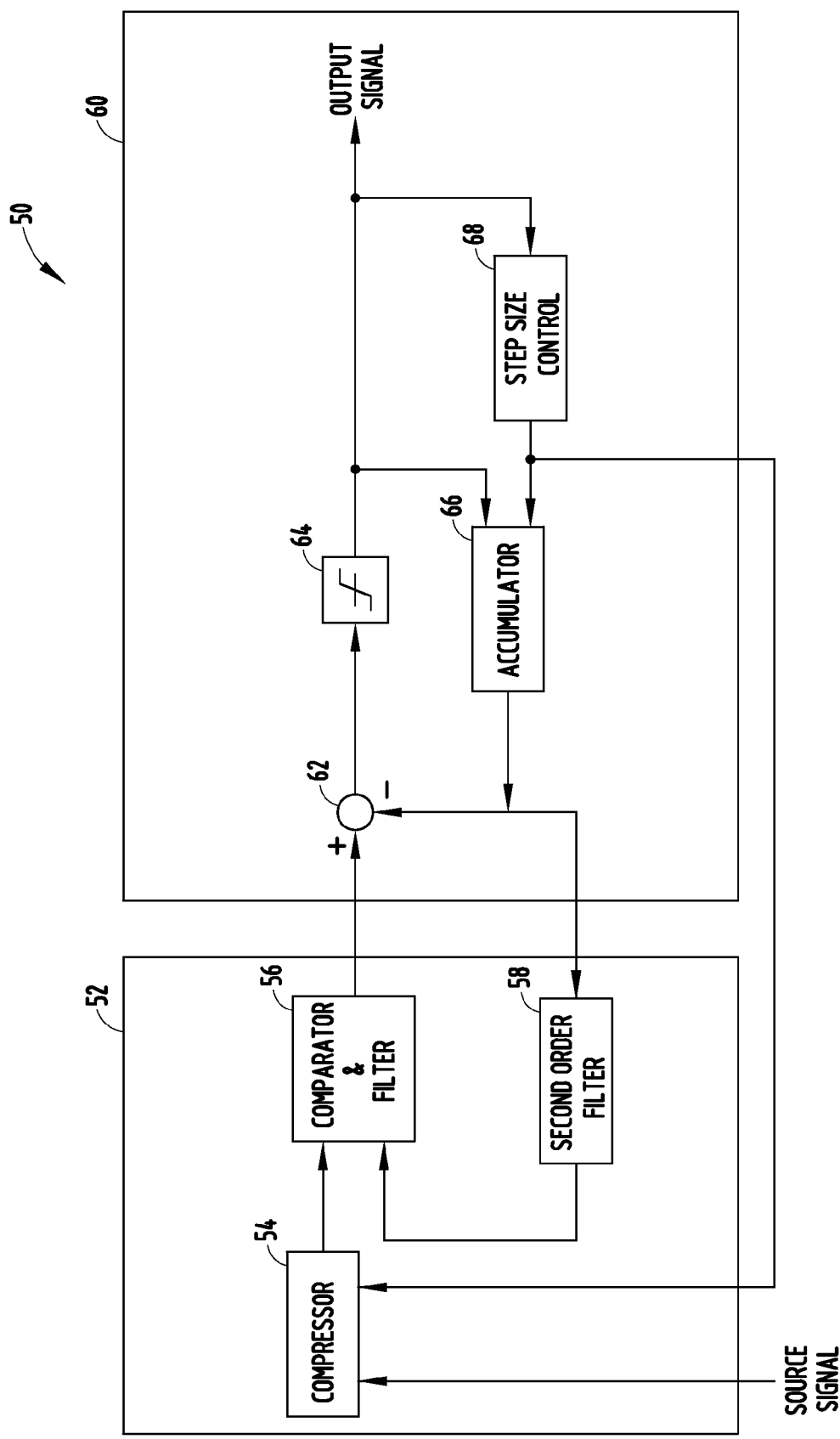
FIG. 6 is a schematic diagram illustrating a system for reducing signal distortion in a device employing continuously variable slope delta modulation, according to another embodiment of the present invention.

FIG. 6 provides additional detail of a system for reducing signal distortion in a device employing a digital implementation of a continuously variable slope delta modulation scheme in a BLUETOOTH device, according to another embodiment of the present invention. As shown, the system 50 includes both a pre-processing module 52, and a continuously variable slope delta encoder module 60. In the present embodiment, continuously variable slope delta encoder module 60 is part of a Bluecore 2 Bluetooth chipset commercially available from Cambridge Silicon Radio (CSR), running CVDS encoding software. As shown, continuously variable slope delta encoder module 60 contains elements typically found in a continuously variable slope delta encoder module. These elements include a comparator 62 having an input signal input and a feedback input from an accumulator 66, and having an output to level detection circuitry 64. Comparator 62 and level detection circuitry 64 compare the value of the input signal with the feedback signal from the accumulator 66, outputting a digital "0" if the value of the input signal is greater than or equal to the value of the feedback signal, and outputting a digital "1" if the value of the input signal is less than the value of the feedback signal. This digital output of level detection circuitry 64 is transmitted as an output of continuously variable slope delta encoder module 60. The digital output of level detection circuitry 64 is also provided to step size control unit 68 and to accumulator 66. Accumulator 66 either increases or decreases its stored value based on the digital value it receives from level detection unit 64. If the value received from level detection unit 64 is a "1," accumulator 66 decreases its stored value by a predetermined amount. If the digital value received from level detection unit 64 is a "0," accumulator 66 increases its stored value by a predetermined amount.

To determine the amount by which accumulator 66 increases or decreases its stored value, and the rate at which the increase or decrease changes over time, accumulator 66 uses as an input a syllabic signal received from step size control unit 68. In operation, step size control unit 68 evaluates the values output by level detection circuitry 64 to determine whether the encoder module is in a slew rate limited condition. A slew rate limited condition is indicated when four consecutive bits of the same polarity (all "1's" or all "0's") are detected by step size control unit 68. Step size control unit 68 also determines how long a slew rate limited condition has existed. Based on the existence of a slew rate limited condition and the length of time that the slew rate limited condition has existed, step size control unit 68 provides a syllabic signal indicating to accumulator 66 whether to increase or decrease the stored value, and whether or not to change the rate at which the stored value is increased or decreased over time.

Unlike in traditional continuously variable slope delta encoder modules, FIG. 6 shows step size control unit 68 also providing a syllabic signal to pre-processing module 52. As noted above, this syllabic signal is indicative of whether or not a slew rate limited condition exists and how long a slew rate limited condition has existed. As will be discussed, pre-processing module 52 uses this information to determine how to process a pre-processed signal to be provided to continuously variable slope delta encoder module 60.

Returning to continuously variable slope delta encoder module 60, accumulator 66 is shown receiving signals from level detection circuitry 64 and step size control unit 68, and providing a feedback signal to comparator 62. As accumulator 66 increases or decreases its stored value based on the signals from level detection circuitry 64 and step size control unit 68, the feedback signal of accumulator 66 will, over time, track the value of the input signal to comparator 60.

Unlike in traditional continuously variable slope delta encoder modules, FIG. 6 also shows accumulator 66 providing a feedback signal to pre-processing module 52. As will be discussed, pre-processing module 52 uses the feedback signal provided by accumulator 66 to determine how to pre-process a source signal before providing that pre-processed signal to continuously variable slope delta encoder module 60. As shown in FIG. 6, rather than receiving a source input signal directly from a source, such as a microphone, or other signal source, continuously variable slope delta encoder module 60 receives a pre-processed signal from pre-processing module 52. Pre-processing module 52 is shown receiving a source signal from a source, such as a microphone. Pre-processing module 52 alters the source signal based on the feedback signal received from accumulator 66, and provides a resulting pre-processed signal to continuously variable slope delta encoder module 60. Pre-processing module 52 is also shown receiving a syllabic signal from step size control unit 68. Pre-processing module 52 alters the source signal based on the syllabic signal to provide a pre-processed signal to comparator 62 of continuously variable slope delta encoder module 60. It should be understood that pre-processing module 52 can alter the source signal to provide a pre-processed signal using either the feedback signal from accumulator 66, the syllabic signal from step size control unit 68, or both signals simultaneously.

As shown, the source signal provided to pre-processing module 52 is first provided to a compressor 54. In the present embodiment, compressor 52 is part number SSM2120, commercially available from Analog Devices. The syllabic signal from step size control unit 68 provided to pre-processing module 52 is coupled to compressor 54. Based on the value of the syllabic signal received from step size control unit 68, compressor 54 increases, decreases, or leaves unchanged the level of the source signal provided to the remaining circuitry in pre-processing module 52. For example, if compressor 54 determines, based on the syllabic signal from step size control unit 68, that a slew rate limited condition exists, compressor 54 can decrease the amplitude of the input signal to help alleviate the slew rate limited condition. It should be understood that compressor 54 can be any circuitry capable of varying the amplitude of the source signal based on a signal received from step size control unit 68.

As shown, compressor 54 provides the source signal, modified or unmodified, to the positive input of comparator 56 for filtering and processing. Pre-processing module 52 is also shown receiving a feedback signal from accumulator 66. As shown, the signal is first provided to a second order low-pass filter 58 having an $f_3$ equal to 3720 Hz. After being filtered, the feedback signal is connected to the negative input of comparator 56. This has the effect of subtracting the value of the filtered feedback signal from accumulator 66 from the source signal and integrating that difference. This integrated difference at the output of comparator 56 is shown being provided as a pre-processed signal input to continuously variable slope delta encoder module 60.

The pre-processing of the input signal in pre-processing module 52 based on the feedback signal from accumulator 66 and the syllabic signal from step size control unit 68, as discussed above, can substantially decrease distortion associated with continuously variable slope delta encoder module 60. One skilled in the art will appreciate that the functionality discussed above can be implemented using discrete components or integrated circuits, and may also be implemented in software algorithms running on microcontrollers, digital signal processors (DSPs), or computers.

Figure 7:
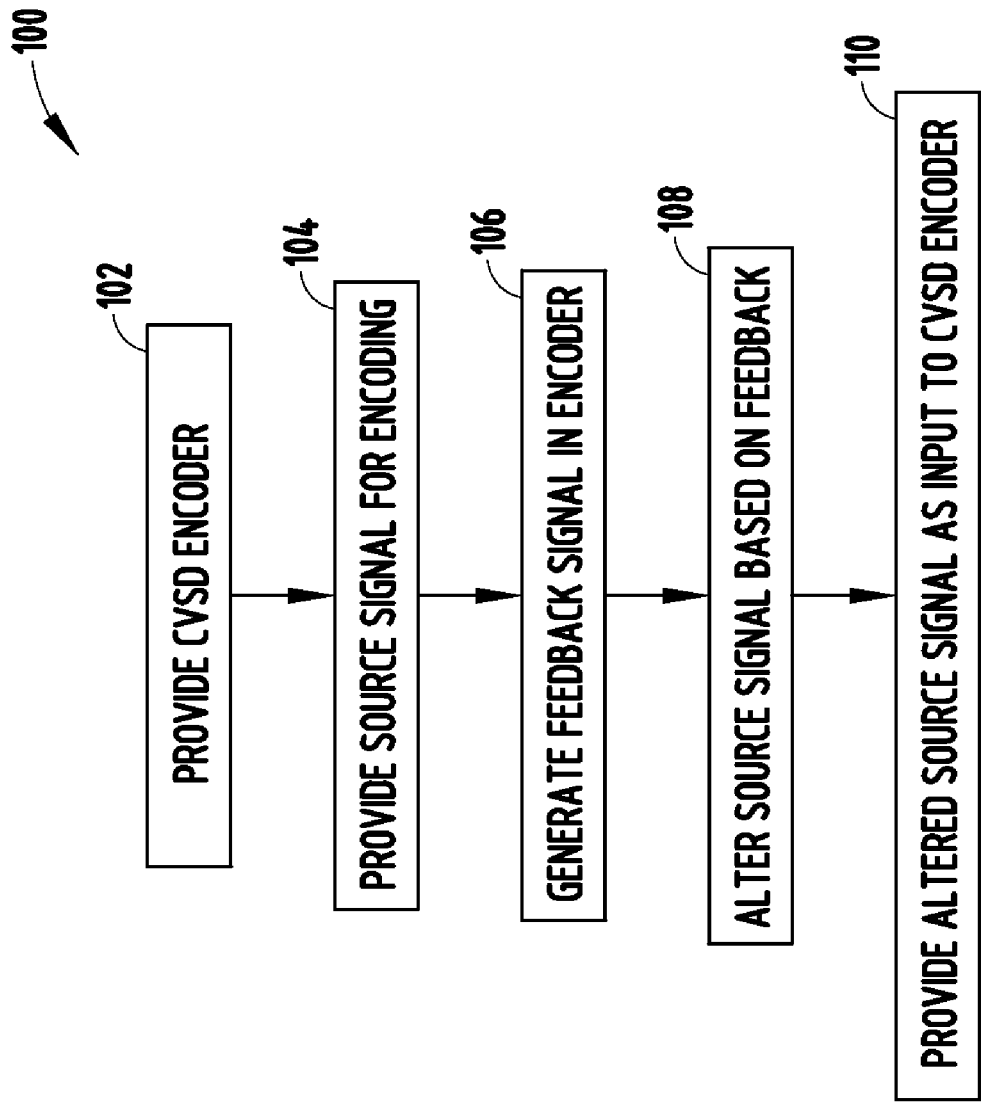
FIG. 7 is a flow diagram illustrating a method for reducing distortion in a system employing continuously variable slope delta modulation, according to one embodiment of the present invention.

Referring to FIG. 7, a method 100 for reducing signal distortion in a device employing continuously variable slope delta modulation is provided, according to one embodiment of the present invention. In a first step 102, a continuously variable slope delta modulation encoder module is provided. In a second step 104, a source signal for encoding by the continuously variable slope delta modulation encoder is provided. In step 106, a feedback signal is generated in the continuously variable slope delta modulation encoder. In step 108, the source signal is altered based on the feedback signal generated by the continuously variable slope delta modulation encoder. Finally, in step 110, the altered source signal is provided as an input to the continuously variable slope delta modulation encoder.

One skilled in the art will appreciate that the steps provided in the method 100 can be accomplished by discrete circuitry, integrated circuits, or a combination of discrete circuitry and integrated circuits. In addition, one skilled in the art will appreciate that the steps provided in method 100 can be accomplished by means of a software algorithm running in a microcontroller, digital signal processor (DSP), or microprocessor. In a software implementation of the method of FIG. 7, or the various embodiments described in FIGS. 3A-6, the input signals, output signals, feedback signals, and various circuit elements can all be implemented in software running in a microcontroller, digital signal processor (DSP), or microprocessor.

It should be appreciated that the output signals from the CVSD encoder modules of the various embodiments of the present invention may be compatible with existing CVSD decoders. It should also be appreciated that in alternate embodiments of the present invention in which the invention is implemented in software algorithms, the software algorithms may be programmed into and/or executed on existing CVSD encoder hardware to enable re-use of existing hardware to provide improved CVSD encoder performance.

Figure 8:
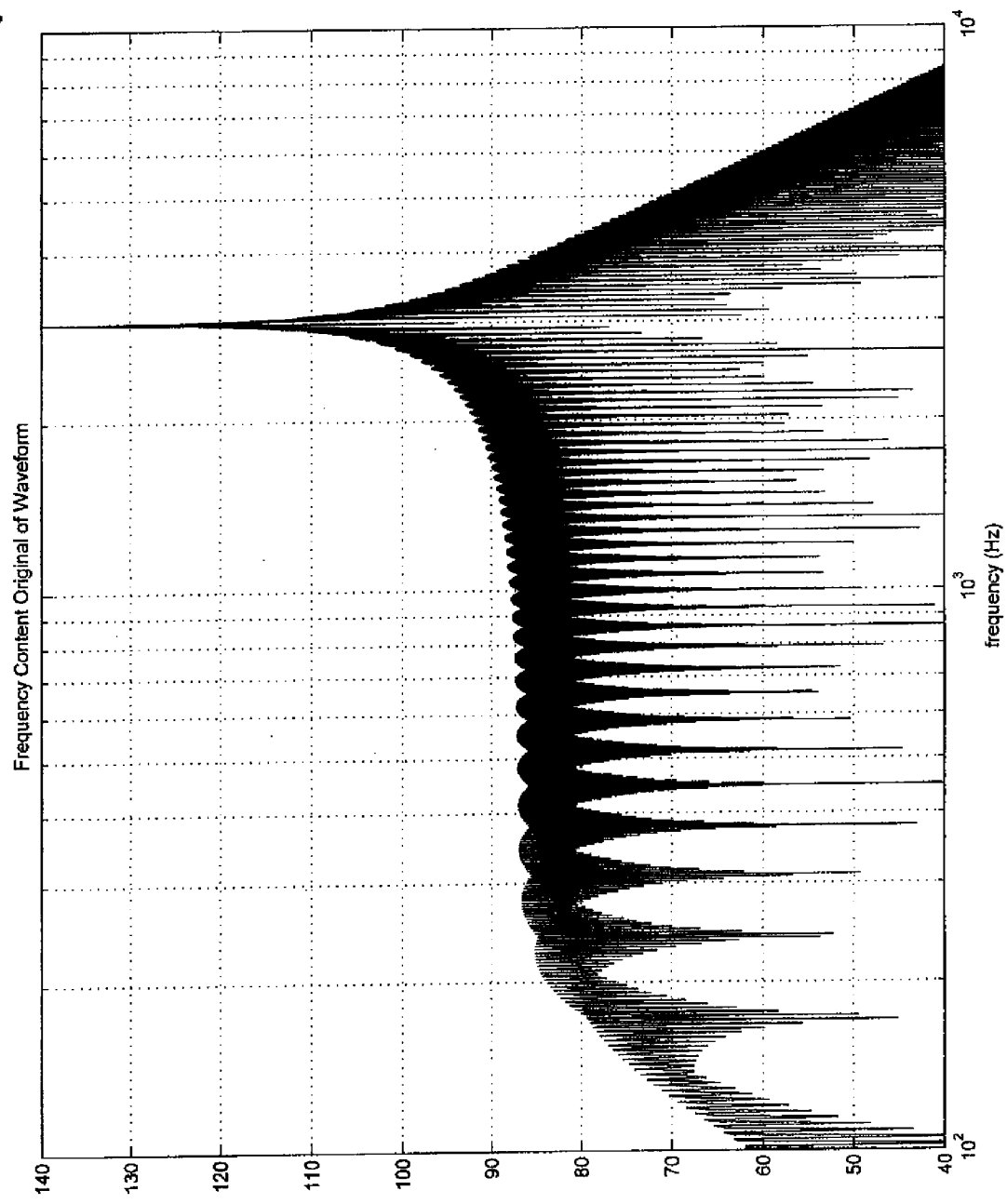
FIG. 8 is a chart generally illustrating the frequency content of a signal provided to a continuously variable slope delta modulator.
Figure 9:
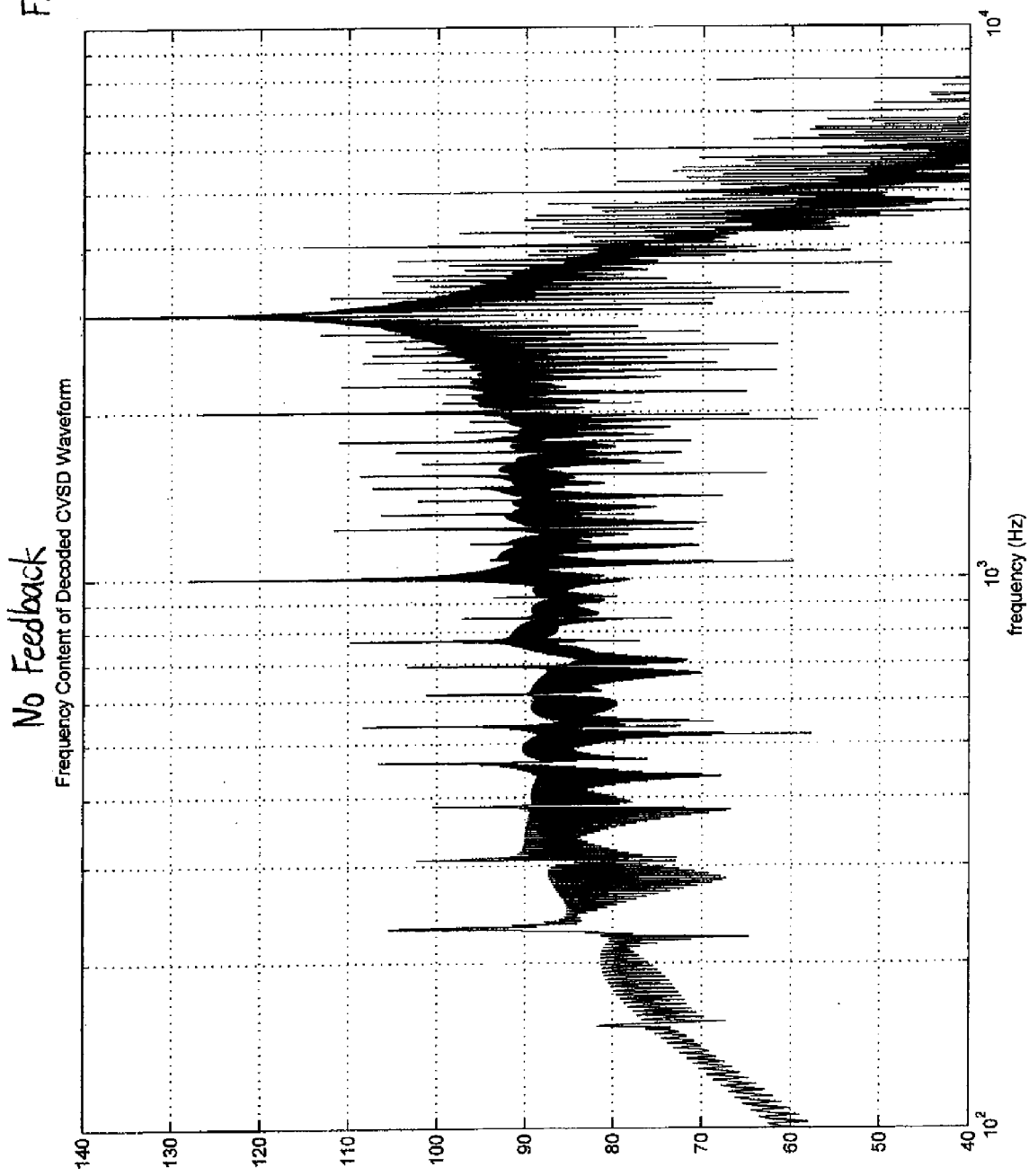
FIG. 9 is a chart generally illustrating the frequency content of a signal produced by a typical continuously variable slope delta modulator in response to the signal of FIG. 8.
Figure 10:
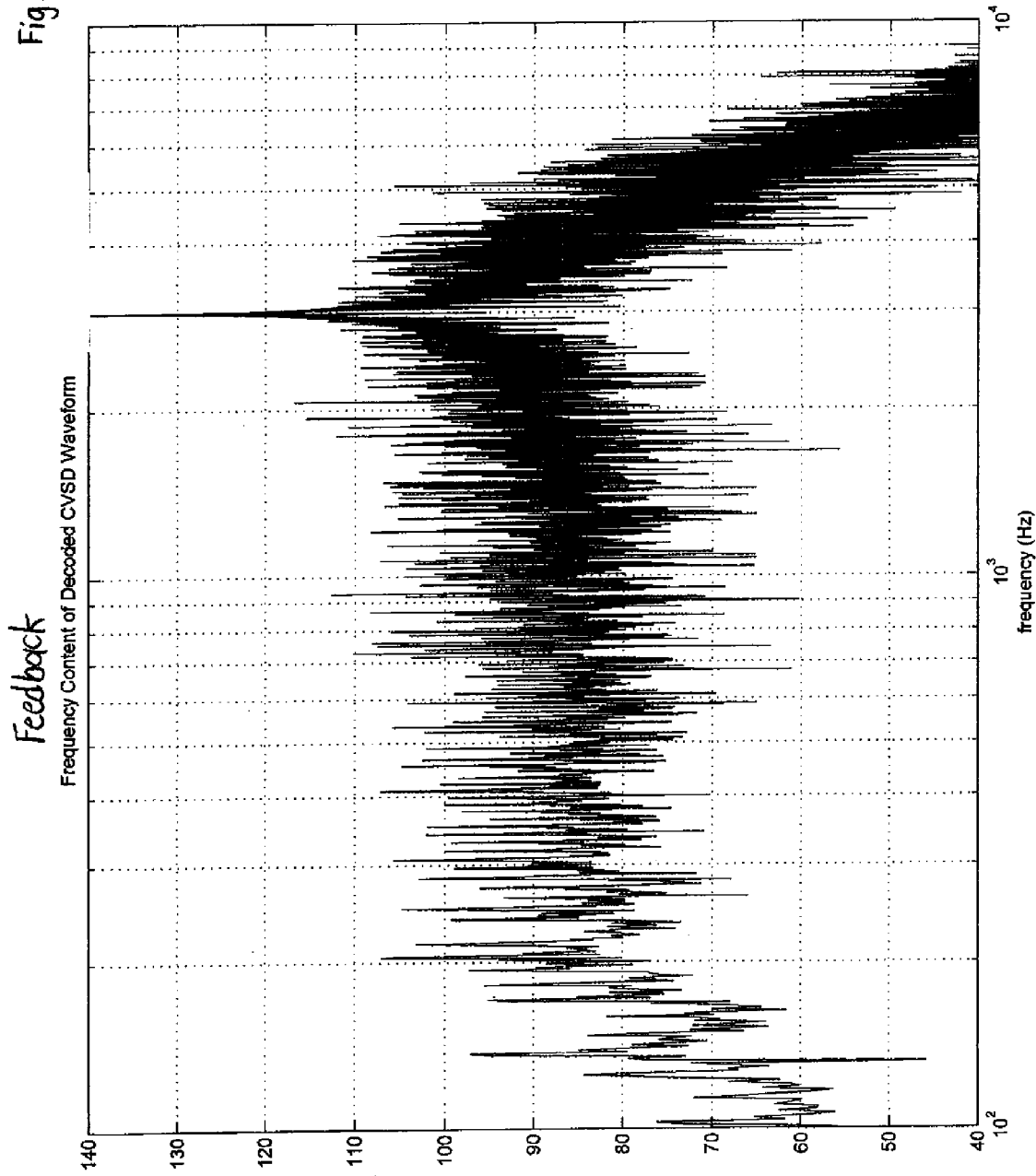
FIG. 10 is a chart generally illustrating the frequency content of a signal produced in response to the signal of FIG. 8 by a system employing continuously variable slope delta modulation according to one embodiment of the present invention.

FIG. 8 generally illustrates the frequency content of an input waveform provided to both a typical CVSD encoder, and to an improved system according to the embodiments generally illustrated in FIGS. 3A-6 above. FIG. 9 generally illustrates the frequency content of the output of the reconstruction integrator/compressor of a typical CVSD encoder in response to the input waveform of FIG. 8. FIG. 10 generally illustrates the frequency content of the output of the reconstruction integrator/compressor of an improved system in response to the same waveform. By comparing FIGS. 9 and 10, it can be seen that the magnitude of a number of the sub harmonic frequencies (including, for example, 1000 Hz and 2000 Hz) has been reduced in FIG. 10 through the use of the improved system.

Figure 11:
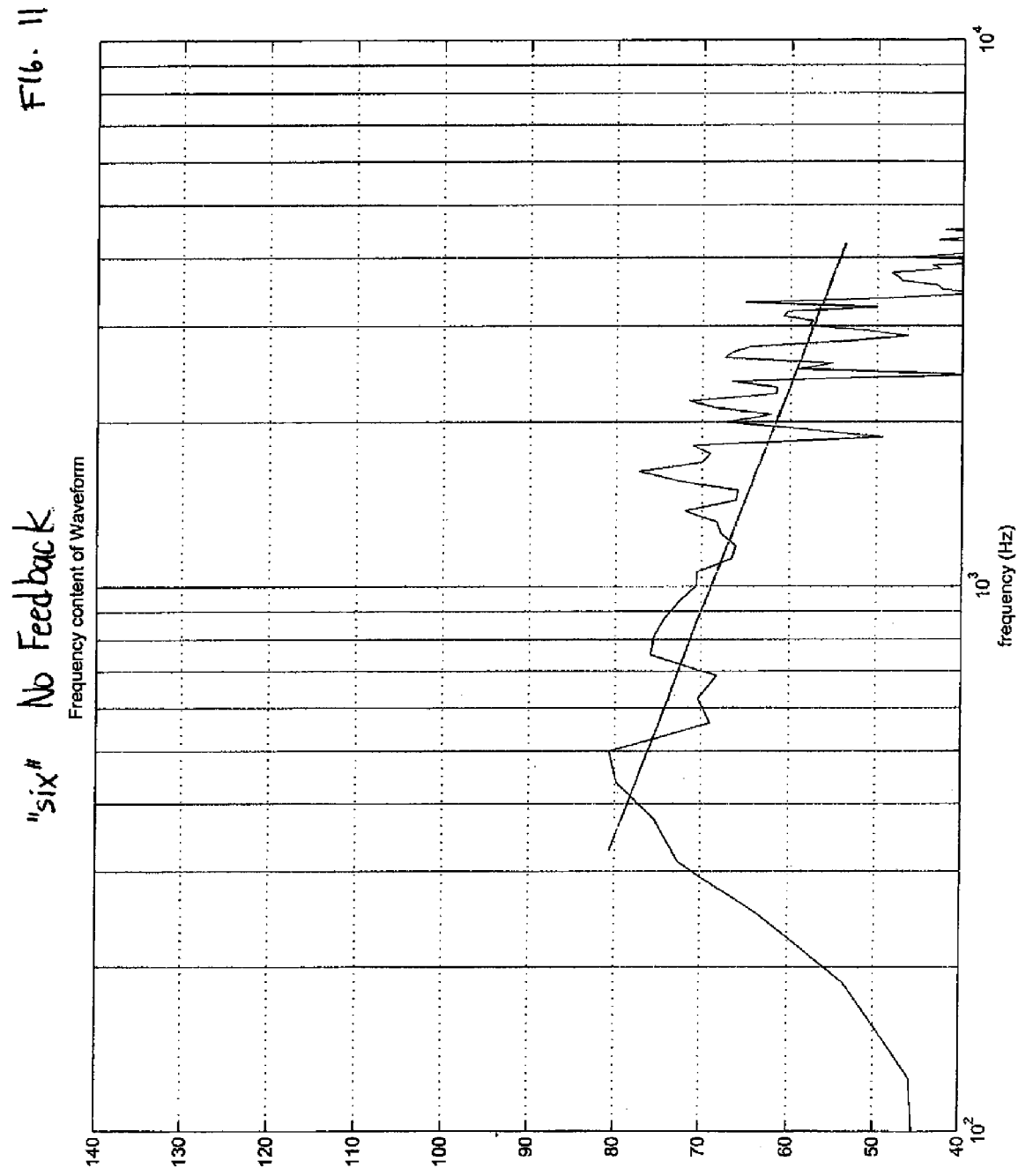
FIG. 11 is a chart generally illustrating the frequency content of a signal produced by a typical continuously variable slope delta modulator in response to an input signal.
Figure 12:
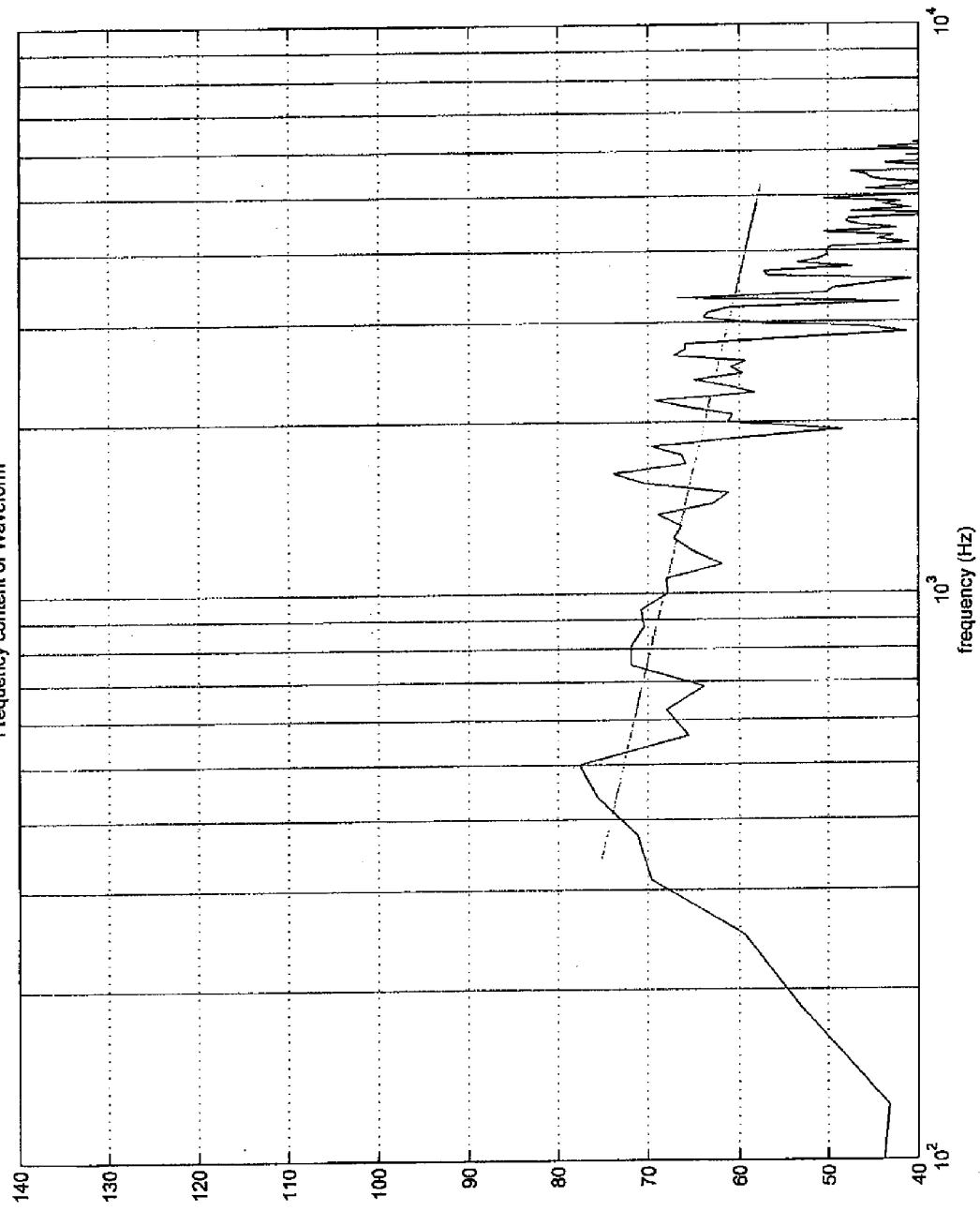
FIG. 12 is a chart generally illustrating the frequency content of a signal produced in response to the input signal of FIG. 11 by a system employing continuously variable slope delta modulation according to one embodiment of the present invention.

FIG. 11 generally illustrates the frequency content of the output of the reconstruction integrator/compressor of a typical CVSD encoder in response to an input waveform. FIG. 12 generally illustrates the frequency content of the output of the reconstruction integrator/compressor of an improved system according to the embodiments generally illustrated in FIGS. 3-6 above, in response to the same input waveform. As noted above, by comparing FIGS. 11 and 12, it can be seen that FIG. 12 exhibits improved frequency response over FIG. 11.

Figure 13:
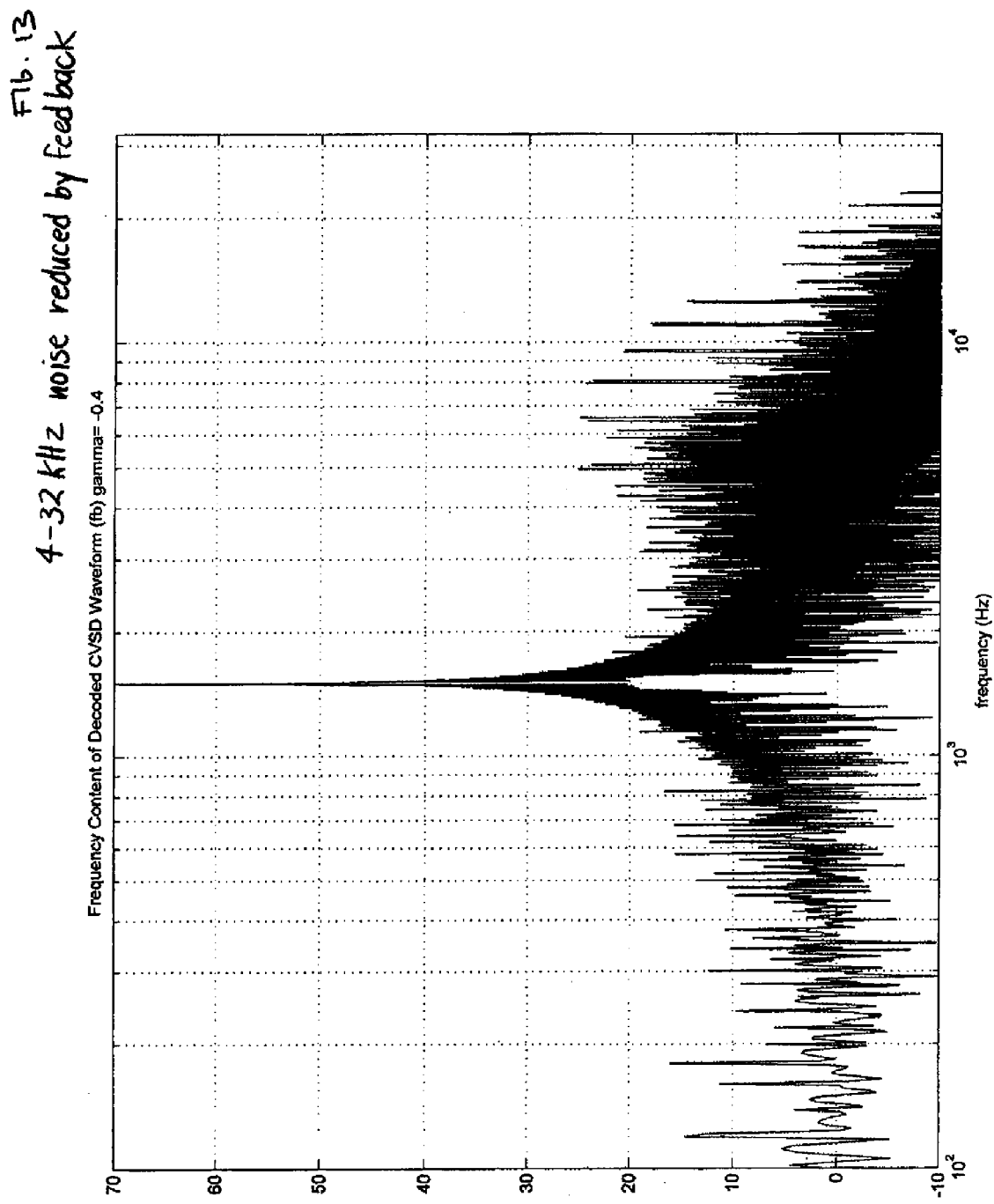
FIG. 13 is a chart generally illustrating the frequency content of a signal produced by a typical continuously variable slope delta modulator in response to a 2 kHz tone.
Figure 14:
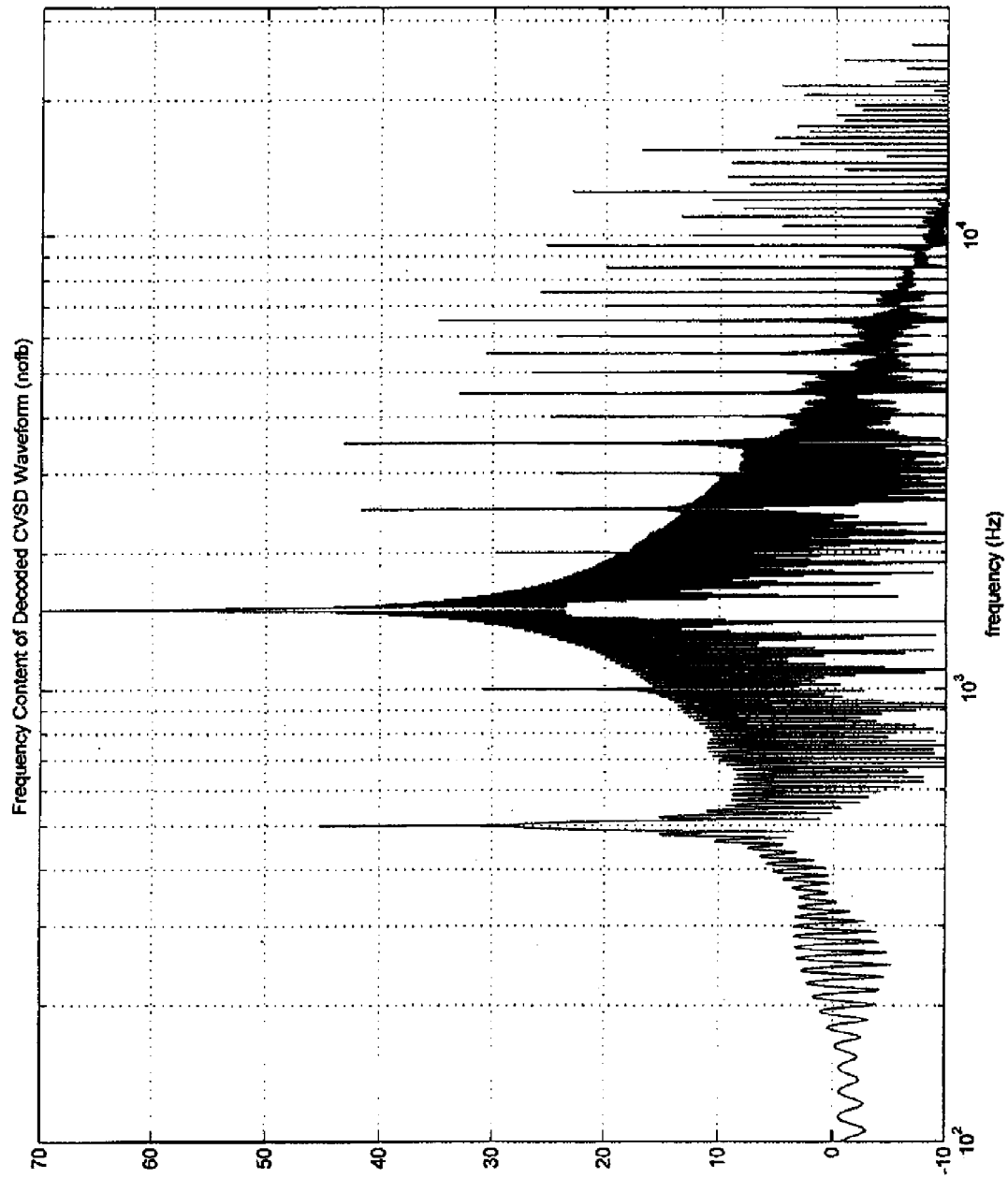
FIG. 14 is a chart generally illustrating the frequency content of a signal produced in response to a 2 kHz tone by a system employing continuously variable slope delta modulation according to one embodiment of the present invention.

FIG. 14 generally illustrates the frequency content of the output of the reconstruction integrator/compressor of a typical CVSD encoder in response to a 2 kHz tone. FIG. 13 generally illustrates the frequency content of the output of the reconstruction integrator/compressor of an improved system according to the embodiments generally illustrated in FIGS.

3-6 above, in response to a 2 kHz tone. As noted above, by comparing FIGS. 14 and 13, it can be seen that magnitude of a number of the sub harmonic frequencies (including, for example, 500 Hz and 1 kHz) has been reduced in FIG. 13 through the use of the improved system. In addition, FIG. 13 illustrates that the power spectral density in the 4-32 kHz range has been reduced over that illustrated in FIG. 14 by use of the improved system, and is in fact at a level well below that required by the Bluetooth specification.

Appendix A is a code listing of software used to simulate a method and system for reducing signal distortion in a device employing continuously variable slope delta modulation, according to one embodiment of the present invention.

The above description is considered that of the preferred embodiments only. Modifications of the invention will occur to those skilled in the art and to those who make or use the invention. Therefore, it is understood that the embodiments shown in the drawings and discussed above are merely for illustrative purposes and not intended to limit the scope of the invention, which is defined by the following claims as interpreted according to the principles of patent law, including the doctrine of equivalents.

What is claimed is:

1. A rearview assembly for a vehicle, said rearview assembly comprising:
    a mounting structure for attaching to a vehicle, said mounting structure comprising a housing;
    a rearview element disposed in said housing for providing the driver with a view to the rear of the vehicle;
    a continuously variable slope delta encoder module disposed on or within said mounting structure, wherein said continuously variable slope delta encoder module is configured to generate a feedback signal;
    a pre-processing module disposed on or within said mounting structure, wherein said pre-processing module is configured to receive a source signal, a feedback signal and a first filtered signal from a first filter to generate a pre-processed signal that is a function of the source signal and the feedback signal, and to supply the pre-processed signal to said continuously variable slope delta encoder module, and
    wherein said continuously variable slope delta encoder module generates the feedback signal as a function of the pre-processed signal received from said pre-processing module.

2. The rearview assembly of claim 1, further comprising at least one microphone disposed on or within said mounting structure and coupled to said pre-processing module, wherein said source signal is an output of said at least one microphone.

3. The rearview assembly of claim 2, further comprising a first wireless audio/data transceiver coupled to at least one of said pre-processing module and said continuously variable slope delta encoder module for transmitting a signal that is a function of the pre-processed signal.

4. The rearview assembly of claim 2, further comprising a switching module for switching between multiple microphones.

5. The rearview assembly of claim 1, wherein said rearview element is a mirror element.

6. The rearview assembly of claim 1, wherein said rearview element is a display element.

7. The rearview assembly of claim 1, further comprising a speaker disposed on or within said mirror mounting structure.

8. The rearview assembly of claim 1, wherein said first filter is a syllabic filter configured to provide at least one syllabic signal indicative of a syllabic rate of speech associated with the pre-processed signal.

9. The rearview assembly of claim 8, wherein said pre-processing module comprises a means for varying the amplitude of the source signal, and wherein said means for varying the amplitude of the source signal varies the amplitude of the source signal responsive to the at least one syllabic signal.

10. The rearview assembly of claim 1, wherein said pre-processing module comprises a means for subtracting the feedback signal from the source signal.

11. The rearview assembly of claim 10, wherein said pre-processing module further comprises a second filter for filtering the feedback signal prior to subtracting the feedback signal from the source signal.

12. The rearview assembly of claim 1, wherein said continuously variable slope delta encoder module comprises a delta modulator of at least the second order, said delta modulator in turn comprising a first order delta modulator.

13. The rearview assembly of claim 1, further comprising a first wireless audio/data transceiver coupled to at least one of said pre-processing module and said continuously variable slope delta encoder module for transmitting a signal that is a function of the pre-processed signal.

14. The rearview assembly of claim 13, further comprising a second wireless audio/data transceiver for receiving a signal from said first wireless audio/data transceiver.

15. The rearview assembly of claim 1, wherein the source signal is an audio signal.

16. A system for reducing signal distortion in a device employing a continuously variable slope delta modulation scheme, comprising:
    a continuously variable slope delta encoder module, wherein said continuously variable slope delta encoder module is configured to generate a first filtered signal and a feedback signal; and
    a pre-processing module, wherein said pre-processing module is configured to receive a source signal, the feedback signal and the first filtered signal to generate a pre-processed signal that is a function of the source signal and the feedback signal, and to supply the pre-processed signal to said continuously variable slope delta encoder module, and wherein said continuously variable slope delta encoder module generates the feedback signal as a function of the pre-processed signal received from said pre-processing module.

17. The system of claim 16, wherein said continuously variable slope delta encoder module comprises an integrator configured to generate an integrated signal approximating the pre-processed signal, and wherein the feedback signal comprises the integrated signal.

18. The system of claim 16, wherein the first filtered signal is provided by a syllabic filter configured to provide said first filtered signal indicative of a syllabic rate of speech associated with the pre-processed signal.

19. The system of claim 18, wherein said pre-processing module comprises a means for varying the amplitude of the source signal, and wherein said means for varying the amplitude of the source signal varies the amplitude of the source signal responsive to said first filtered signal.

20. The system of claim 16, wherein said continuously variable slope delta encoder module comprises an integrator configured to generate an integrated signal approximating the pre-processed signal, and wherein said continuously variable slope delta encoder module further comprises a syllabic filter configured to provide said first filtered signal indicative of a syllabic rate of speech associated with the pre-processed signal.

21. The system of claim 16, wherein said pre-processing module comprises a means for subtracting the feedback signal from the source signal.

22. The system of claim 21, wherein said pre-processing module further comprises a second filter for filtering the feedback signal prior to subtracting the feedback signal from the source signal.

23. The system of claim 16, wherein said continuously variable slope delta encoder module comprises a delta modulator of at least the second order, said delta modulator in turn comprising a first order delta modulator.

24. The system of claim 16, further comprising a first wireless audio/data transceiver coupled to at least one of said pre-processing module and said continuously variable slope delta encoder module for transmitting a signal that is a function of the pre-processed signal.

25. The system of claim 24, wherein said continuously variable slope delta encoder module is mounted in a vehicle.

26. The system of claim 24, further comprising a second wireless audio/data transceiver for receiving a signal from said first wireless audio/data transceiver.

27. The system of claim 16, wherein said continuously variable slope delta encoder module is mounted in a vehicle.

28. The system of claim 16, further comprising a microphone coupled to said pre-processing module.

29. The system of claim 28, wherein said microphone is located in a mirror assembly in a vehicle.

30. The system of claim 16, wherein the source signal is an audio signal.

31. The system of claim 16, wherein said continuously variable slope delta encoder module is further configured to provide an output signal that is a function of the pre-processed signal, and wherein the output signal is compatible with typical CVSD decoders.

32. An audio/data transceiver device, comprising:
a continuously variable slope delta encoder module, wherein said continuously variable slope delta encoder module is configured to generate a feedback signal and a first filtered signal from a first filter;
a pre-processing module, wherein said pre-processing module is configured to receive a source signal, feedback signal and the first filtered signal from said continuously variable slope delta encoder module to generate a pre-processed signal that is a function of the source signal and the feedback signal, and to supply the pre-processed signal to said continuously variable slope delta encoder module, wherein said continuously variable slope delta encoder module generates the feedback signal as a function of the pre-processed signal received from said pre-processing module; and
a wireless audio/data transceiver coupled to at least one of said continuously variable slope delta encoder module and said pre-processing module.

33. The audio/data transceiver device of claim 32, wherein said wireless audio/data transceiver is configured to transmit a signal generated by said continuously variable slope delta encoder module.

34. The audio/data transceiver device of claim 32, wherein said wireless audio/data transceiver is capable of transmitting signals compliant with the BLUETOOTH standard.

35. The audio/data transceiver device of claim 32, wherein said continuously variable slope delta encoder module comprises an integrator configured to generate an integrated signal approximating the pre-processed signal, and wherein the feedback signal comprises the integrated signal.

36. The audio/data transceiver device of claim 32, wherein said first filter is a syllabic filter configured to provide at least one syllabic signal indicative of a syllabic rate of speech associated with the pre-processed signal, and wherein the feedback signal comprises the at least one syllabic signal.

37. The audio/data transceiver device of claim 36, wherein said pre-processing module comprises a means for varying the amplitude of the source signal, and wherein said means for varying the amplitude of the source signal varies the amplitude of the source signal responsive to the at least one syllabic signal.

38. The audio/data transceiver device of claim 32, wherein said continuously variable slope delta encoder module comprises an integrator configured to generate an integrated signal approximating the pre-processed signal, and wherein said first filter is a syllabic filter configured to provide at least one syllabic signal indicative of a syllabic rate of speech associated with the pre-processed signal, wherein the feedback signal comprises the integrated signal and the syllabic signal.

39. The audio/data transceiver device of claim 32, wherein said pre-processing module comprises a means for subtracting the feedback signal from the source signal.

40. The audio/data transceiver device of claim 39, wherein said pre-processing module further comprises a second filter for filtering the feedback signal prior to subtracting the feedback signal from the source signal.

41. The audio/data transceiver device of claim 32, wherein said continuously variable slope delta encoder module comprises a delta modulator of at least the second order, said delta modulator in turn comprising a first order delta modulator.

42. The audio/data transceiver device of claim 32, wherein said continuously variable slope delta encoder module is mounted in a vehicle.

43. The audio/data transceiver device of claim 32, further comprising a microphone coupled to said pre-processing module.

44. The audio/data transceiver device of claim 32, wherein said microphone is located in a mirror assembly in a vehicle.

45. The audio/data transceiver device of claim 32, wherein the source signal is an audio signal.

46. The audio/data transceiver device of claim 32, wherein said continuously variable slope delta encoder module is further configured to provide an output signal that is a function of the pre-processed signal, and wherein the output signal is compatible with typical CVSD decoders.

47. A method for reducing distortion in a system employing continuously variable slope delta modulation (CVSD), comprising the steps of:
providing a continuously variable slope delta encoder module that encodes an input signal;
providing a source signal for encoding by said continuously variable slope delta encoder module;
generating a feedback signal in said continuously variable slope delta encoder module;
altering the source signal based on a first filtered signal and the feedback signal generated in said continuously variable slope delta encoder module to provide a pre-processed signal; and
providing the pre-processed signal, the integrated signal and the first filtered signal as the input signal to said continuously variable slope delta encoder module.

48. The method of claim 47, wherein the feedback signal generated in said continuously variable slope delta encoder module comprises said integrated signal provided by integration circuitry for approximating the pre-processed signal.

49. The method of claim 47, wherein the first filtered signal is a syllabic signal provided by syllabic filter circuitry and indicative of a syllabic rate of speech associated with the pre-processed signal.

50. The method of claim 49, wherein the step of altering the source signal includes the step of altering the amplitude of the source signal responsive to the syllabic signal.

51. The method of claim 47, wherein the first filtered signal is a syllabic signal provided by a syllabic filter module and is indicative of a syllabic rate of speech associated with the pre-processed signal, and further comprises an integrated signal provided by integration circuitry and approximating the pre-processed signal.

52. The method of claim 47, wherein the step of altering the source signal includes the step of subtracting the feedback signal from the source signal to provide the pre-processed signal.

53. The method of claim 52, further comprising the step of filtering the feedback signal prior to subtracting the feedback signal from the source signal to provide the pre-processed signal.

54. The method of claim 52, further including the step of transmitting the pre-processed signal via a wireless audio/data transceiver to at least one other audio/data transceiver.

55. The method of claim 47, wherein said continuously variable slope delta encoder module comprises a delta modulator of at least the second order, said delta modulator in turn comprising a first order delta modulator.

56. The method of claim 47, further including the step of transmitting a signal that is a function of the pre-processed signal to a wireless audio/data transceiver.

57. The method of claim 56, wherein said continuously variable slope delta encoder module is mounted in a vehicle.

58. The method of claim 47, wherein said continuously variable slope delta encoder module is mounted in a vehicle.

59. The method of claim 47, further including the step of generating the source signal in a microphone.

60. The method of claim 59, wherein the microphone is located in a mirror assembly in a vehicle.

61. The method of claim 47, wherein the source signal is an audio signal.

62. The method of claim 47, wherein said continuously variable slope delta encoder module is further configured to provide an output signal that is a function of the pre-processed signal, and wherein the output signal is compatible with typical CVSD decoders.

63. The method of claim 47, further including the step of providing an output signal from the continuously variable slope delta encoder module that is a function of the pre-processed signal, wherein the output signal is compatible with typical CVSD decoders.

64. A continuously variable slope delta encoder system for reducing signal distortion in an electronic device comprising:
a comparator;
an integrator for providing an integrated signal;
at least one filter for providing a filtered signal;
a pre-processing module configured to receive a source signal, integrated signal and the filtered signal for generating a pre-processed signal that is a function of the source signal and the integrated signal; and
wherein the pre-processed signal and the integrated signal are supplied to the comparator for generating a feedback signal that is a function of the pre-processed signal received from the pre-processing module.

* * * * *